(12) United States Patent
Longley

(10) Patent No.: US 8,626,810 B2
(45) Date of Patent: Jan. 7, 2014

(54) METHOD AND SYSTEM FOR FINITE IMPULSE RESPONSE (FIR) DIGITAL FILTERING

(75) Inventor: Lester Anderson Longley, Atlanta, GA (US)

(73) Assignee: Texas Instruments Incorporated, Dallas, TX (US)

( * ) Notice: Subject to any disclaimer, the term of this patent is extended or adjusted under 35 U.S.C. 154(b) by 870 days.

(21) Appl. No.: 12/781,467

(22) Filed: May 17, 2010

(65) Prior Publication Data

US 2010/0293214 A1 Nov. 18, 2010

Related U.S. Application Data

(60) Provisional application No. 61/178,554, filed on May 15, 2009.

(51) Int. Cl.
*G06F 17/10* (2006.01)
*G06F 15/00* (2006.01)

(52) U.S. Cl.
USPC .......................... 708/319; 708/215; 708/405

(58) Field of Classification Search
USPC ................................................ 708/300–323
See application file for complete search history.

(56) References Cited

U.S. PATENT DOCUMENTS

| | | |
|---|---|---|
| 6,625,629 B1 | 9/2003 | Garcia |
| 6,741,706 B1 | 5/2004 | McGrath et al. |
| 6,973,403 B1 * | 12/2005 | Preuss ........................... 708/405 |
| 7,290,021 B2 * | 10/2007 | Gray ............................. 708/300 |

OTHER PUBLICATIONS

Jason R. Vandekieft, "Computational Improvements to Linear Convolution with Multirate Filtering Methods", University of Miami School of Music research project, approved by Prof. W. Pirkle, Prof. K. Pohlmann, and Dr. J. Collins, Coral Gables, FL, Apr. 30, 1998, pp. 1-10, available at http://www.music.miami.edu/programs/mue/Research/janvdekieft/jvtitle.htm.

Guillermo Garcia, "Optimal Filter Partition for Efficient Convolution with Short Input/Output Delay", Audio Engineering Society 113th Convention, Convention Paper 5660, Los Angeles, CA, Oct. 5-8, 2002, pp. 1-9.

Grant R. Griffin, "FIR Filter Basics", Dec. 15, 2009, pp. 1-2, available at http://www.dspguru.com/book/export/html/4.

* cited by examiner

*Primary Examiner* — Tan V. Mai
(74) *Attorney, Agent, or Firm* — Robert D. Marshall, Jr.; W. James Brady; Frederick J. Telecky, Jr.

(57) ABSTRACT

A method for finite impulse response (FIR) digital filtering is provided that includes generating a frequency domain sample block from an input sample block of length L, adding the computed frequency domain sample block to a reverse time-ordered set of previously generated frequency domain sample blocks as a newest frequency domain sample block, computing a spectral multiplication of each of K newest frequency domain sample blocks in the reverse time-ordered set with a corresponding frequency domain filter block in a time-ordered set of K frequency domain filter blocks of a FIR filter, adding the K results of the K spectral multiplications to generate an output spectral block, inverse transforming the output spectral block to generate a time domain output block, and outputting L filtered output samples from the time domain output block.

13 Claims, 6 Drawing Sheets

INPUT SAMPLE BLOCKS, EACH OF LENGTH L, OVERLAPPED BY N-L SAMPLES

N-POINT DFT OF EACH EXTENDED SAMPLE BLOCK IS COMPUTED

METHOD AND SYSTEM FOR FINITE IMPULSE RESPONSE (FIR) DIGITAL FILTERING

CROSS-REFERENCE TO RELATED APPLICATIONS

This application claims benefit of U.S. Provisional Patent Application Ser. No. 61/178,554, filed May 15, 2009, which is incorporated herein by reference in its entirety.

BACKGROUND OF THE INVENTION

Digital filters are often important components of audio and video processing systems. One type of digital filter often used in such systems is a finite impulse response (FIR) filter. A typical FIR filter is a linear-phase filter that delays the input signal without distorting the phase of the input signal. The delay on the input signal may be implemented as a set of memory elements, i.e., a delay line, that store the delayed elements of the FIR calculation.

In general, a FIR filter operates by convolving the input signal with the impulse response, i.e., the set of coefficients, of the filter. In implementation, different techniques may be used to perform the convolution such as, for example, direct time domain convolution, single-block convolution, multi-block convolution, and frequency-domain delay line (FDL) convolution. While there is no inherent latency in direct time domain convolution, the computational cost may be high for long convolutions as the computation cost increases linearly with the length of the filter. Thus, direct time domain convolution may be unsuitable for real-time filtering.

Single-block convolution, also referred to as frequency domain block convolution, is based on the fact that multiplication in the frequency domain is equivalent to circular convolution in the time domain. Since this technique uses circular convolution, a Discrete Fourier Transform (DFT) is used. The DFT may be implemented with a Fast Fourier Transform (FFT) algorithm. Two well-known techniques for single block convolution are referred to as "overlap-save" and "overlap-add." Each of these techniques computes the DFT of the input sample block, multiplies the result by the DFT of the entire impulse response, and obtains a time-domain output block of samples by performing the inverse transform of the result of the multiplication. The DFT of the impulse response may be pre-computed. The computational cost of these techniques increase logarithmically with the length of the filter, rather than linearly. However, these techniques have an inherent input to output latency equal to the length of the block as the input sample block must be full before beginning computation. Thus, single-block convolution may also be unsuitable for real-time filtering due to the high latency.

Multi-block convolution may be used to reduce the latency while keeping the computational cost at an acceptable level. In multi-block convolution, the filter is divided into shorter blocks, frequency-domain block convolutions are performed on the shorter blocks, and the outputs of the convolutions are summed to obtain the filtered result. The length of the filter blocks may be chosen according to different criteria, such as a desired latency.

In FDL convolution, similar to multi-block convolution, the filter is divided into shorter blocks, and a DFT of each block is calculated using an FFT algorithm. A DFT of the input sample block is also performed using an FFT algorithm, the DFT of the input sample block is spectrally multiplied with the DFTs of each of the filter blocks, and the blocks resulting from the spectral multiplications are overlap-added to generate an output spectral block, and an inverse FFT is performed on the output spectral block to create a time domain output block. The length of the filter blocks maybe chosen, for example, to minimize the computational cost of FDL convolution. FDL convolution is describe in more detail in U.S. Pat. No. 6,625,629, entitled "System and Method for Signal Processing Using an Improved Convolution Technique," filed on May 23, 2000.

While digital FIR filters using known convolution techniques may be adequate for many audio and video applications, there is an ever present demand for faster and more complex digital signal processing in such applications. Accordingly, improvements in digital FIR filters are needed.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
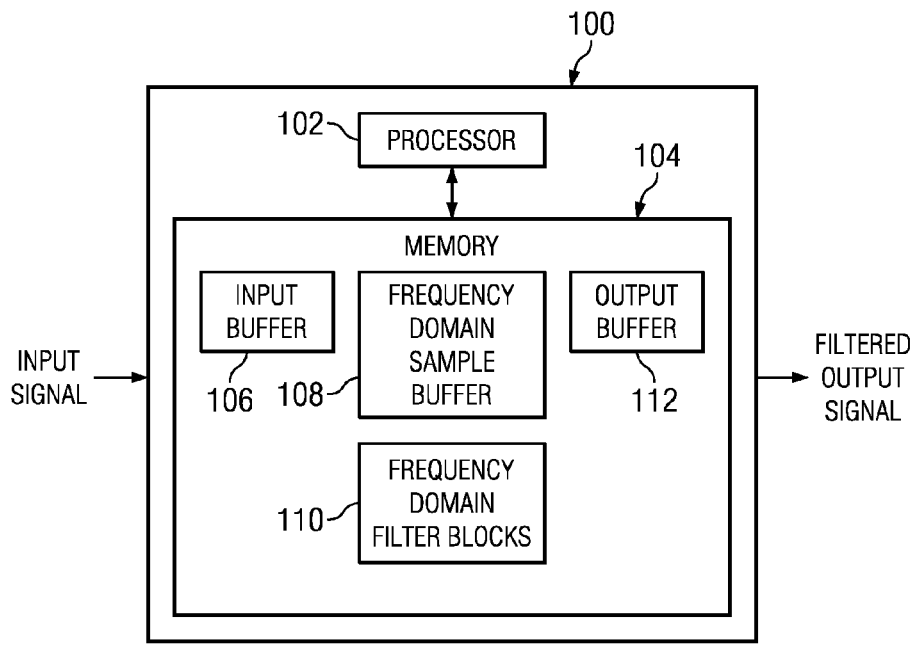
FIG. 1 shows a block diagram of a digital system in accordance with one or more embodiments of the invention.

Specific embodiments of the invention will now be described in detail with reference to the accompanying figures. Like elements in the various figures are denoted by like reference numerals for consistency.

Certain terms are used throughout the following description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. In addition, although method steps may be presented and described herein in a sequential fashion, one or more of the steps shown and described may be omitted, repeated, performed concurrently, performed at different times, and/or performed in a different order than the order shown in the figures and/or described herein. Accordingly, embodiments of the invention should not be considered limited to the specific ordering of steps shown in the figures and/or described herein.

Certain symbols are used throughout the following description, the drawings, and the claims to refer to particular aspects of embodiments of the invention. As one skilled in the art will appreciate, different symbols may be used without departing from the described functionality. Table 1 defines the symbols used herein.

TABLE 1

| Symbol | Description |
|---|---|
| NH | Length of the impulse response of a FIR filter |
| M | Length of a filter block |
| K = ceil(NH ÷ M) | Number of filter blocks |
| L | Length of an input sample block; L = M |
| N | Number of points in DFT (Discrete Fourier Transform); N ≥ L + M − 1 |
| $h(n), n = 0, \ldots, NH − 1; h(n) = 0, n = NH, \ldots, K \cdot M$ | FIR filter coefficients (filter impulse response) |
| $h_k(m) = h(m + k \cdot M),\ m = 0, \ldots, M − 1;\ k = 0, \ldots, K − 1;\ h_k(m) = 0,\ m = M, \ldots, N − 1$ | $k^{th}$ (non-overlapping) segment of $h(\cdot)$ |
| $H_k(n), n = 0, \ldots, N − 1$ | $DFT_N\{h_k(\cdot)\}$ |
| $x(n), n = 0, 1, 2, \ldots;\ x(n) = 0, n < 0$ | (discrete-time) input signal |
| $x_j(n) = x(n + (j + 1) \cdot L − N),\ n = 0, \ldots, N − 1$ | $j^{th}$ segment of $x(\cdot)$ - note that segments overlap |
| $X_j(n), n = 0, \ldots, N − 1$ | $DFT_N\{x_j(\cdot)\}$ |
| $Y_j(n), n = 0, \ldots, N − 1$ | $sum[k = 0, \ldots, K − 1\ of\ X_{j−k}(n) \cdot H_k(n)], n = 0, \ldots, N − 1$ |
| $y_j(n), n = 0, \ldots, N − 1$ | $Re[IDFT_N\{Y_j(\cdot)\}]$ - real part of inverse DFT |
| $y(n) = y_j(n − (j + 1) \cdot L + N),\ j = floor(n ÷ L)$ | (discrete time) output signal |

In general, embodiments of the invention provide for finite impulse response (FIR) filtering using a novel form of multi-block convolution with a delay line for blocks of transformed input samples, i.e., frequency domain sample blocks. The coefficients representing the impulse response of a FIR filter of length NH are segmented into K time domain filter blocks of length M. These time domain filter blocks are then transformed using an N-point Discrete Fourier Transform (DFT) into K frequency domain filter blocks. Input sample blocks of length L=M are received and transformed into frequency domain sample blocks using an N-point DFT. At each cycle of the filtering process, a new frequency domain sample block is generated and the previously computed frequency domain sample blocks are moved down a delay line to accommodate the new frequency domain sample block. Then, the newest K frequency domain sample blocks in the delay line are spectrally multiplied by corresponding frequency domain filter blocks, and the K results of the spectral multiplies are added to generate an output spectral block. An N-point inverse DFT is performed on the output spectral block to generate a time domain output block. N−L samples are then discarded from the time domain output block to generate a block of filtered output samples of the same length as an input sample block.

Embodiments of the invention may require less computation time than direct time domain convolution and have less input-to-output latency than single-block convolution techniques such as overlap-add and overlap-save. Further, embodiments of the invention may require fewer memory accesses and minimize memory requirements as compared to frequency-domain delay line (FDL) convolution through the use of a single delay line, e.g., a single buffer, for frequency domain sample blocks as compared to the use of multiple delay lines, e.g., multiple buffers, to store outputs of the spectral multiplications. In one or more embodiments of the invention, the delay line for the frequency domain sample blocks is implemented such that the blocks are stored in the delay line only when created and need not be copied or moved again. For example, the newest frequency domain sample block can overwrite the oldest block in the delay line in memory and a circular array of pointers can be used to access the blocks in creation time order.

FIG. 1 shows a block diagram of a digital system (100) implementing FIR filtering in accordance with one or more embodiments of the invention. The digital system (100) includes a processor (102) and a memory (104) storing an input buffer (106), a frequency domain sample buffer (108), an output buffer (112), and frequency domain filter blocks (110). The digital system (100) may be implemented in any suitable combination of software, firmware, and hardware, such as, for example, one or more digital signal processors (DSPs), microprocessors, discrete logic, application specific integrated circuits (ASICs), field-programmable gate arrays (FPGAs), etc. The digital system (100) may operate on one or more computer systems at one or more locations. If the processor is implemented in software, the processor may be loaded and executed on a DSP, a general purpose microprocessor, or any other suitable processing component.

The memory (104) may be any suitable combination of memory devices and may include both on-chip memory and external memory. The various buffers (106, 108, 112) and the frequency domain filter blocks (110) may be stored in either on-chip memory or external memory. For example, for computational efficiency, the frequency domain sample buffer (108) and the frequency domain filter blocks (110) may be in on-chip memory while the input buffer (106) and output buffer (112) may be in external memory.

An input signal of samples to be filtered, e.g., a sequence of audio samples, is received by the digital system (100) in the input buffer (106) and communicated to the processor (102). The input signal may be received in the input buffer (106) from any suitable component or device such as, for example, an analog-to-digital converter, a signal generation device, or another signal processing component. The samples in the input buffer (106) may be communicated to the processor (102) as blocks of L samples.

The frequency domain filter blocks (110) are frequency domain representations of the impulse response of the filter. The frequency domain filter blocks (110) are generated by segmenting the coefficients of the filter into K time domain filter blocks of length M and performing an N-point DFT on each of the time domain filter blocks to generate the K frequency domain filter blocks (110). In one or more embodiments of the invention, the frequency domain filter blocks (110) are computed prior to use in filtering the input signal and stored in memory (104). This computation may be performed on another digital system or on the digital system (100). In some embodiments of the invention, the frequency domain filter blocks (110) are computed at various times during the filtering process as the impulse response of the filter changes. Filter segmentation and generation of frequency domain filter blocks are described in more detail below.

The frequency domain sample buffer (108) provides the delay line of the filter. As such, the frequency domain sample buffer (108) stores frequency domain sample blocks generated from the input sample blocks. The frequency domain sample blocks are stored in the frequency domain sample buffer (108) such that the blocks may be accessed according to the order in which they are generated. That is, the frequency domain sample blocks in the frequency domain sample buffer (108) represent a reverse time-ordered set (newest to oldest) of frequency domain sample blocks. The frequency domain sample buffer (108) may be, for example, a circular buffer that implements "movement" of the frequency domain sample blocks through the delay line without having to move the blocks in memory. Alternatively, a circular array of pointers into the frequency domain sample buffer (108) may be used to implement the movement without having actual movement of the blocks. In one or more embodiments of the invention, the frequency domain sample buffer (108) is sized to store K frequency domain sample blocks.

The processor (102) receives an input sample block of L samples from the input buffer (106) and extends the input sample block to generate an extended sample block of length N. In the extended sample block, N−L values precede the L samples from the input sample block. Of the N−L values used to extend the input sample block, M−1 of the values are taken from the input sample block immediately preceding the current input sample block. The remaining N−L−M+1 values of the N−L may be any suitable numbers, e.g., 0. In some embodiments of the invention, all of the N−L values are taken from the input sample block immediately preceding the current input sample block. That is, input sample blocks are overlapped to generate extended sample blocks. An example of overlapping is discussed below in reference to FIG. 3 and FIG. 4D.

The processor (102) then computes an N-point DFT of the extended sample block to generate a frequency domain sample block and stores the frequency domain sample block in the frequency domain sample buffer (108) as the newest frequency domain sample block in the delay line. The N-point DFT may be implemented in accordance with a suitable Fast Fourier Transform (FFT) algorithm. The generated frequency domain sample block may replace the oldest frequency domain sample block in the frequency domain sample buffer (108).

The processor then performs K spectral multiplications of newest K frequency domain sample blocks in the frequency domain sample buffer (108) with corresponding frequency domain filter blocks. That is, the newest frequency domain sample block is spectrally multiplied with the frequency domain filter block representing the first M coefficients of the filter, the second newest frequency domain sample block is spectrally multiplied with the frequency domain filter block representing the second M coefficients of the filter, etc. For example, assume K=4. The four frequency domain filter blocks are $H_0$, $H_1$, $H_2$, and $H_3$ where $H_0$ represents the first M coefficients of the filter and $H_3$ represents the final M coefficients of the filter. The four frequency domain sample blocks are $X_{j-3}$, $X_{j-2}$, $X_{j-1}$, and $X_j$ where $X_j$ represents the newest frequency domain sample block in the delay line and $X_{j-3}$ represents the oldest frequency domain sample block in the delay line. That is, the time order of the frequency domain blocks in the delay line from oldest to newest is $X_j$, $X_{j-1}$, $X_{j-2}$, $X_{j-3}$. In this example, $X_{j-3}$ is spectrally multiplied with $H_3$, $X_{j-2}$ is spectrally multiplied with $H_2$, etc.

The processor then adds the K results of the K spectral multiplications to generate an output spectral block and computes an N-point inverse DFT of the output spectral block to generate a time domain output block. The N-point inverse DFT may be implemented in accordance with a suitable inverse FFT algorithm. Finally, the processor discards the initial N−L samples in the time domain sample block to generate a block of L filtered output samples and stores the block in the output buffer (112) for communication to another suitable component or device such as, for example, a signal reproduction device, a digital-to-analog converters, or another signal processing component.

Figure 2:
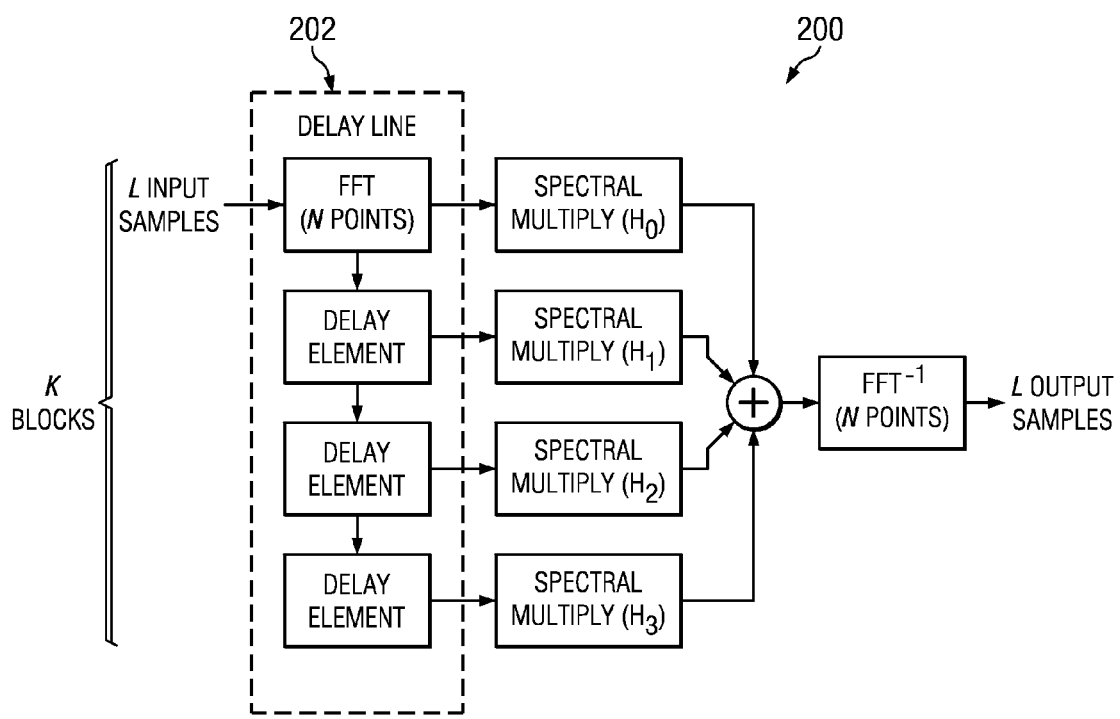
FIG. 2 shows a block diagram of a FIR filter in accordance with one or more embodiments of the invention.

FIG. 2 shows a block diagram of an example FIR filter (200) in accordance with one or more embodiments of the invention. Note that while the description of this example uses the words "shift" or "move" or derivative thereof in describing the operation of the filter, no actual shifting or movement of data may occur in embodiments of the invention. This examples assumes that K=4, i.e., that the coefficients of the filter are segmented into four time domain filter blocks and four frequency domain filter blocks are generated by transforming the four time domain filter blocks into frequency domain filter blocks by application of an N-point DFT. The delay line (202) of the FIR filter (200) accordingly includes four delay elements. These delay elements are used to store frequency domain sample blocks in the order they are generated. That is, the top or first delay element will store the newest frequency domain sample block and the bottom or fourth delay element will store the oldest frequency domain sample block. These delay elements may be initialized with suitable values to be used in the spectral multiplications until a frequency domain filter block is moved down the delay line (202) into a delay element.

Each of the spectral multiply elements spectrally multiplies the frequency domain sample block stored in the corresponding delay element with a frequency domain filter block. The frequency domain filter blocks are applied in reverse time order to the frequency domain sample blocks moving through the delay line (202). More specifically, the impulse response of the filter is a function of time. Thus, the time domain filter blocks of the filter also have a time ordering, and this ordering applies to the frequency domain filter blocks as well. In the application of convolution, the impulse response is time-reversed as it is applied to the input signal such that the newest or latest input sample block is filtered by the initial segment of the impulse response and the oldest or earliest input sample block is filtered by the last segment of the impulse response. In effect, the frequency domain filter blocks represent a time-ordered set of filter blocks and they are applied in increasing time order to frequency domain signal blocks in decreasing time order in the delay line. Accordingly, the top spectral multiply element is associated with, i.e., uses or applies, the frequency domain filter block representing the first M coefficients of the filter, the next spectral multiply element is associated with the frequency domain filter block representing the second M coefficients of the filter, etc.

In operation, at each cycle of the filter (200), L input samples are taken in and L filtered output samples are produced. The L input samples are extended as previously described to form an extended sample block of length N. The extended sample block is then transformed into a frequency domain sample block by application of an N-point DFT implemented by a suitable FFT algorithm. The contents of each delay element in the delay line (202) are shifted down to the next delay element and the frequency domain sample block is then stored in the top delay element of the delay line (202).

Each of the spectral multiply elements then performs a spectral multiplication of the frequency domain sample block in the corresponding delay element with the frequency domain filter block associated with the respective spectral multiply element. The spectral multiply elements may operate sequentially, concurrently, in parallel, or any combination thereof. The outputs of the spectral multiply elements are then added to generate an output spectral block. In some embodiments of the invention, the spectral multiplications and the addition of the outputs are performed sequentially. That is, the initial spectral multiply element produces a result and that result is accumulated in a memory location. The next spectral multiply element produces a result and that result is added to the result of the previous spectral multiple element. This accumulation process continues until the outputs of all of the spectral multiplies are added to the memory location. Once the output spectral block is generated, it is then transformed into a time domain output block by application of an N-point inverse DFT implement by a suitable inverse FFT algorithm. L output samples are then extracted from the time domain output block.

Figure 3:
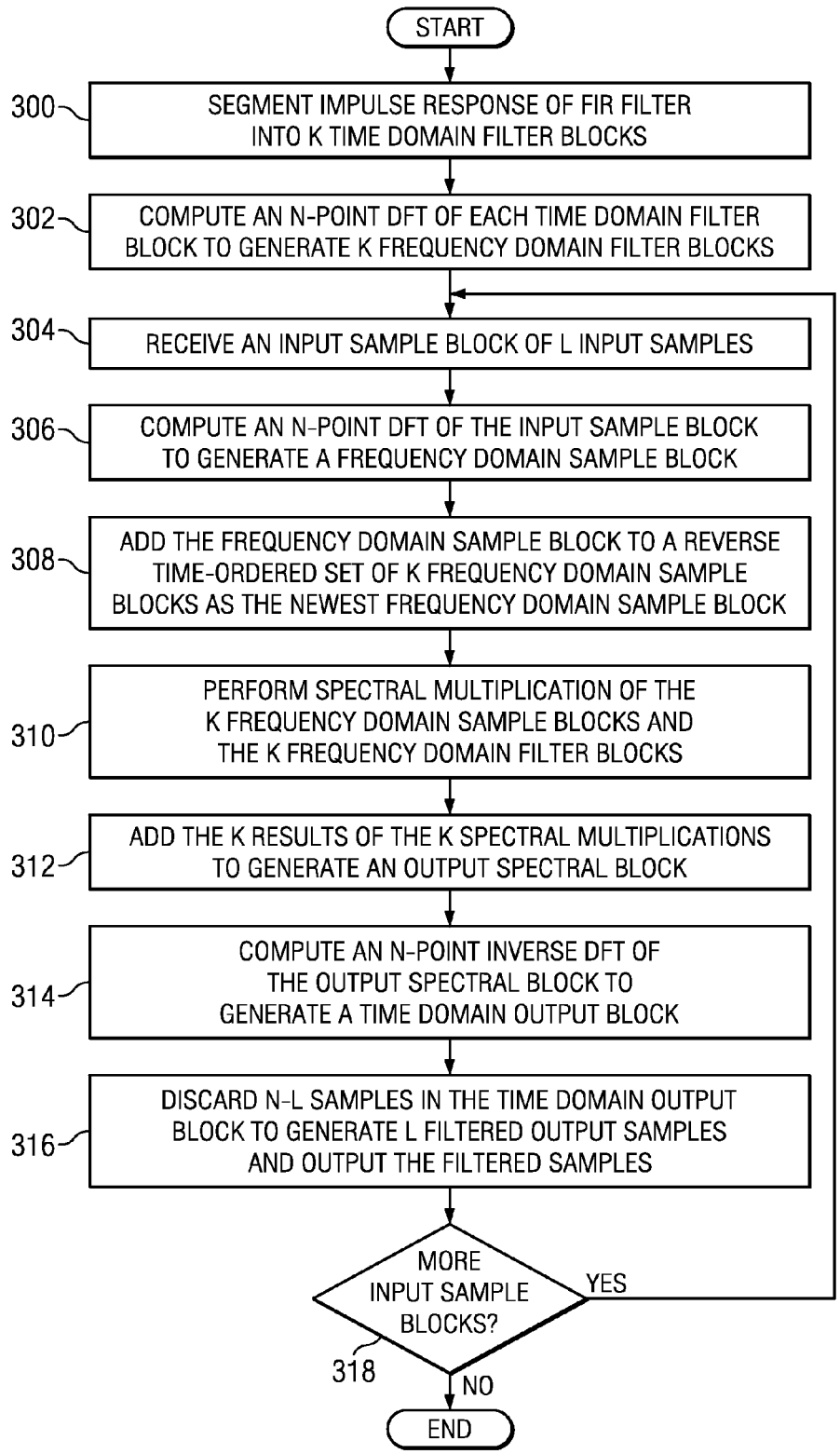
FIG. 3 shows a flow diagram of a method in accordance with one or more embodiments of the invention.
Figure 4A:
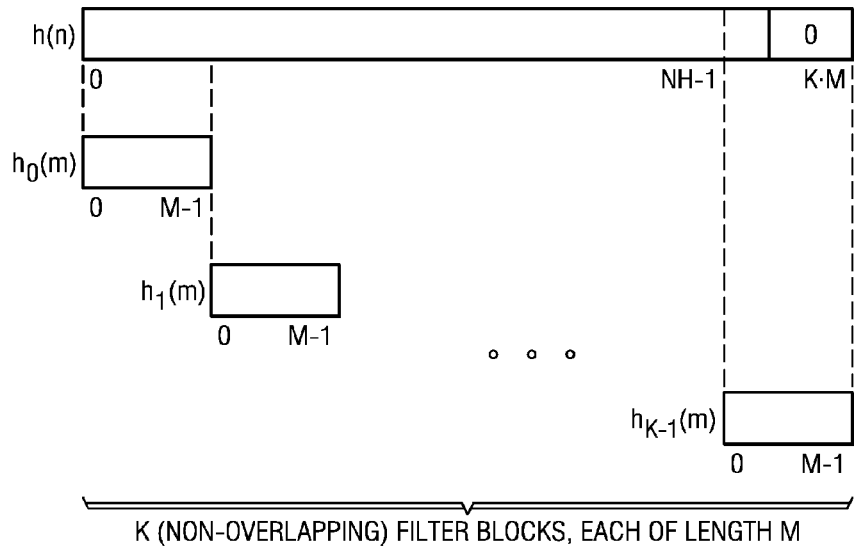
FIGS. 4A-4E show examples in accordance with one or more embodiments of the invention.

FIG. 3 shows a flow diagram of a method for FIR filtering of an input signal of samples. Initially, the impulse response, i.e., the coefficients of the filter, is segmented into K non-overlapping time domain filter blocks (300). Any suitable segmentation technique may be used. For example, the impulse response may be segmented into equal length blocks. The length of each time domain filter block is M. FIG. 4A shows an example of segmentation of the filter coefficients. Note that if M is not a factor of the length NH of the impulse response, i.e., the number of coefficients, the Kth time domain filter block is extended to length M with suitable values, e.g., 0.

Figure 4B:
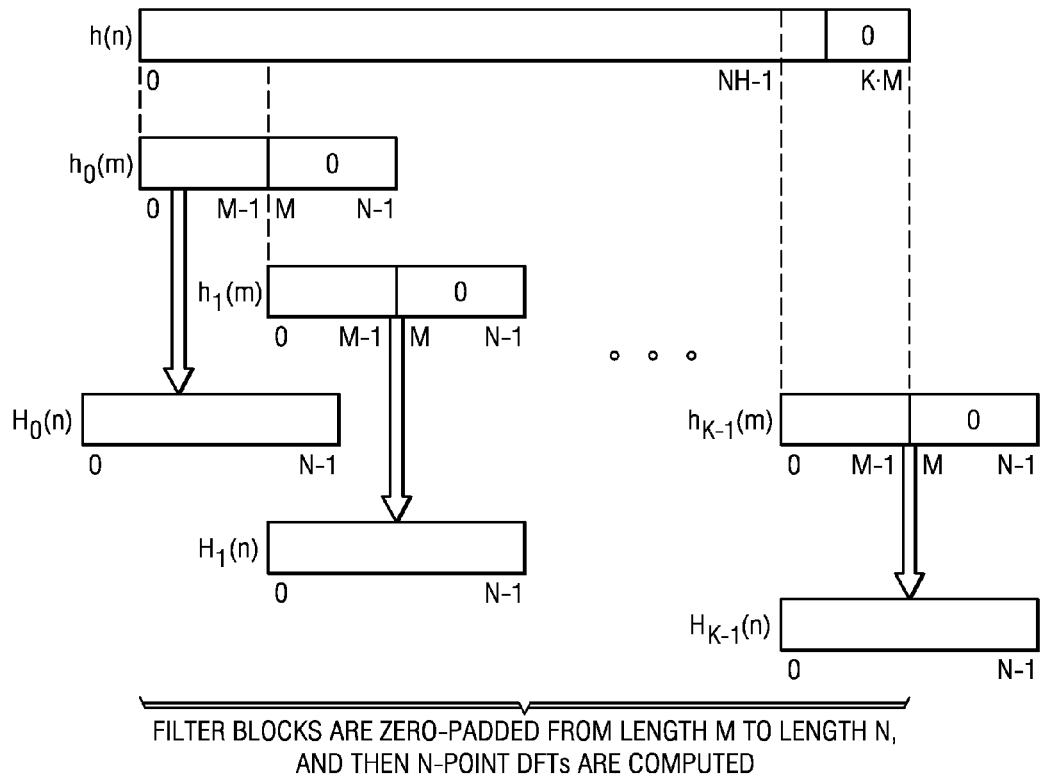

An N-point DFT of each time domain filter block is computed to generate K frequency domain filter blocks (302). As is illustrated in the example of FIG. 4B, each time domain filter block of length M is zero-padded to length N prior to computation of the N-point DFT. The resulting K frequency domain filter blocks are then stored for use during filtering of samples of an input signal. The N-point DFT may be implemented with any suitable FFT algorithm.

Tradeoffs between computational efficiency and memory usage may be considered in selecting the values of N, M, K, and L for a particular embodiment. If N is large, then all other things being equal, more memory will be used than with a smaller value of N but there may be greater computation efficiency. That is, total memory use goes up with increasing DFT size but MIPS tends to go down. In addition, a larger N value may cause longer input to output latency than a smaller N value. However, the relationship N≥L+M−1 must hold. Further, L is required to be the same as M. In some embodiments of the invention, L=M=N/2.

Figure 4C:
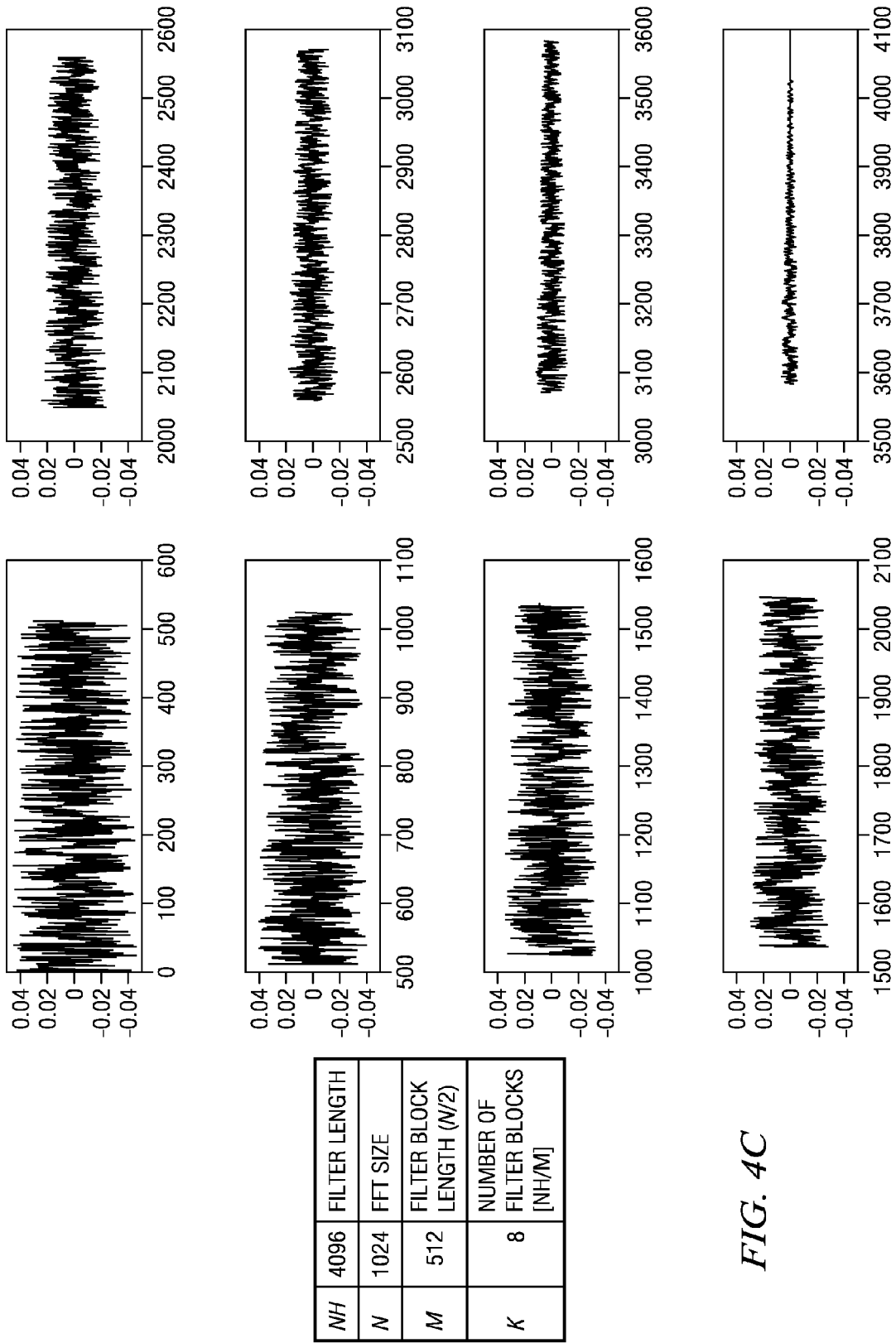

FIG. 4C shows an example of segmentation of a filter having length NH=4096, an FFT size N=1024, and a filter block length M=512, resulting in a number of filter blocks K=8. The eight graphs illustrate the segmentation in eight time domain filter blocks. The X-axis of each graph is the sample number of the impulse response. Thus, the whole impulse response is the top left block concatenated with the one below it followed by the one below that, etc. As can be seen from the graphs, the signal goes from a large value to a small value which is typical of an impulse response of a reverberant environment. As time delay goes on, there is less and less energy. Each of these time domain filter blocks would be transformed by the 1024-point FFT to generate eight frequency domain filter blocks.

Referring again to FIG. 3, an input sample block of L input samples is received (304). Then, an N-point DFT of the input sample block is computed to generate a frequency domain sample block (306). More specifically, the input sample block is extended by N−L values to generate an extended sample block of length N, and the N-point DFT is applied to the extended sample block to generate the frequency domain sample block. The N-point DFT may be implemented with any suitable FFT algorithm.

Figure 4D:
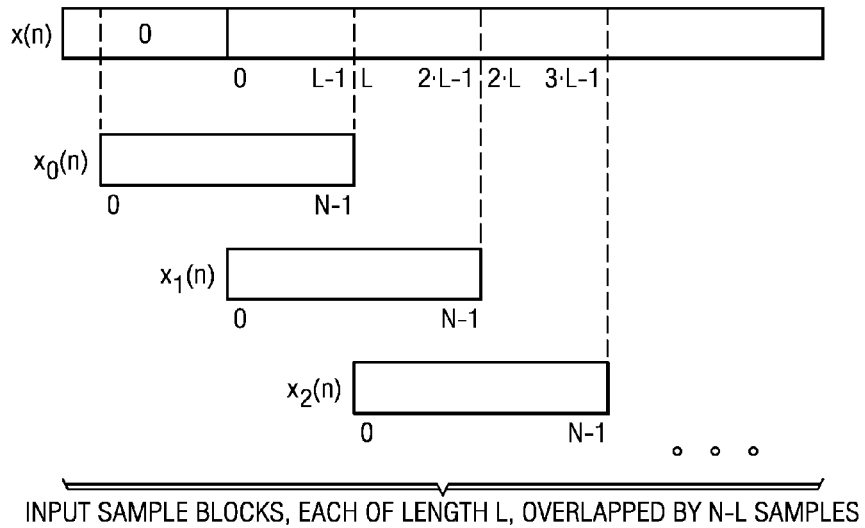
Figure 4E:
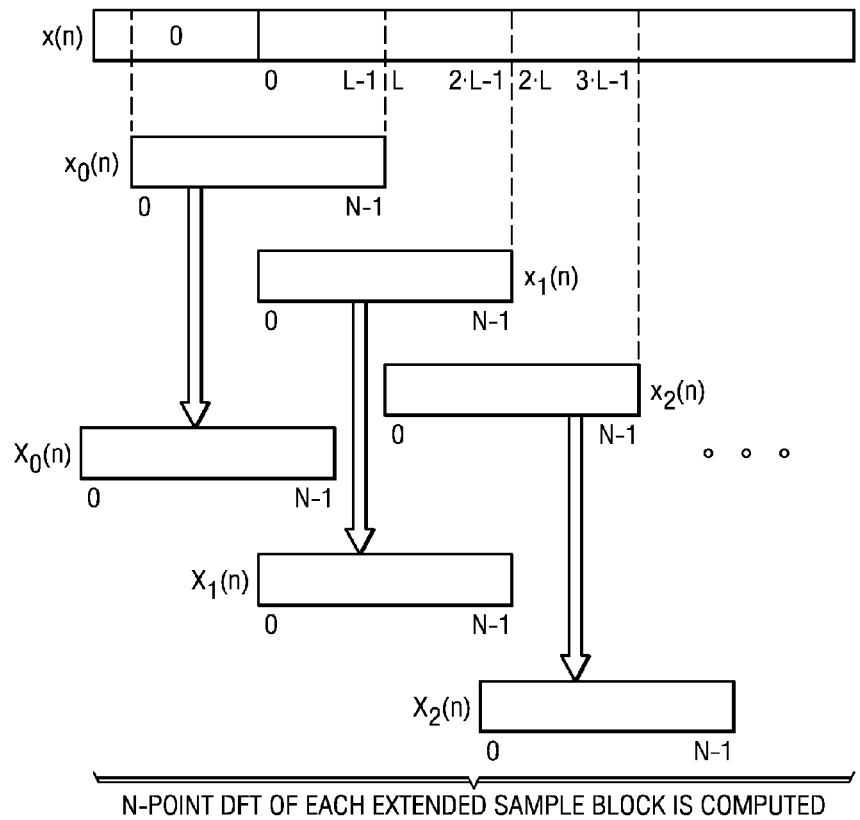

In the extended sample block, N−L values precede the L samples from the input sample block. Of the N−L values used to extend the input sample block, M−1 of the values are taken from the input sample block immediately preceding the current input sample block. The remaining N−L−M+1 values of the N−L may be any suitable numbers, e.g., 0. In some embodiments of the invention, all of the N−L values are taken from the input sample block immediately preceding the current input sample block. That is, input sample blocks are overlapped to generate extended sample blocks. FIG. 4D shows an example of this overlapping. Further, FIG. 4E shows an example of performing the N-point DFT on extended sample blocks generated by overlapping the input sample blocks. Note that the initial input sample block is zero-padded since there is no overlap with a preceding input sample block.

Referring again to FIG. 3, the generated frequency domain sample block is then added to a reverse time-ordered set of K previously generated frequency domain sample blocks as the newest frequency domain sample block (308). In some embodiments of the invention, the oldest frequency domain sample block is removed from the reverse time-ordered set when the generated frequency domain sample block is added. In some embodiments of the invention, this removal is accomplished by replacing the oldest frequency domain sample block in the reverse time-ordered set with the generated frequency domain sample block.

Spectral multiplication of the K frequency domain sample blocks and the K frequency domain filter blocks is then performed. More specifically, each frequency domain sample block is spectral multiplied with a corresponding frequency domain filter block. The correspondence between the frequency domain filter blocks and the frequency domain sample blocks, i.e., the reverse time order application of the filter blocks to the sample blocks, is as was previously described herein. Note that this description assumes the existence of preciously computed frequency domain sample blocks. One of ordinary skill in the art will understand that until K frequency domain sample blocks have been generated during the processing of the input signal, other suitable values may be used in the respective multiplications.

The K results of the K spectral multiplications are then added to generate an output spectral block (312). An N-point inverse DFT of the output spectral block is then computed to generate a time domain output block (314). The N-point inverse DFT may be implemented in accordance with a suitable inverse FFT algorithm. N−L samples of the time domain output block are then discarded to generate L filtered output samples and the filtered samples are output (316). In one or more embodiments of the invention, the last L samples of the output block are output. The filtering process (304-316) is repeated until all input sample blocks are processed (318).

Table 2 is a pseudo code describing of a method of FIR filtering in accordance with one or more embodiments of the invention. This pseudo code is expressed using MATLAB syntax and operations and should be understood by one of ordinary skill in the art having a working knowledge of MATLAB and/or access to a MATLAB programming guide with reference to the definitions in Table 1 and the comments in the pseudo code.

TABLE 2

```
function sigOut = fftfil( sig, fil, N)
%FFTFIL applies (FIR) filter "fil" to signal "sig" using FFT-based
"overlap-save" method
%   fftfil( sig, fil [, N])
%   sig -- (mono) input signal (vector)
%   fil -- (FIR) filter
%        N -- FFT size (default: 1024)
% ..........................................................
if( !( nargin >= 1))
    usage( 'fftfil( sig, fil [, N])');
else
    if( !( nargin >= 3))
        N = 1024;
    end % if
end % if
% ..........................................................
if( !( columns( sig) <= rows( sig)))
    sig = sig'; % assure sig is col vector
end % if
if( !( columns( sig) == 1))
    error( '"sig" must be mono signal');
end % if
% ..........................................................
if( !( nargin >= 2
        && is_struct( fil)
        && struct_contains( fil, 'num')
        && length( fil.num) == 1
        && length( fil.num.c) >= 1
        && !struct_contains( fil, 'den') ))
    error( '"fil" must be FIR filter');
end % if
h = fil.num.c'; % filter coeffs.
if( !( columns( h) <= rows( h)))
    h = h'; % assure h is col vector
end % if
NH= length( h); % (total) filter length
% ..........................................................
if( NH <= N/2 +1)
    M = NH; % (single segment)
else
    M = N/2; % filter segment length
end % if
K = ceil( NH / M); % no. of filter segments to be processed
h = [h ; zeros( K*M-NH, 1)]; % pad h to multiple of M
h = reshape( h, M, K); % K cols, each of length M
% for *each* of K cols of h:
%   zero-pads from length M to length N,
%   then calcs FFT (of each col of (new) length N)
H = fft( h, N);
% ..........................................................
if( K == 1)
    for j = 1:31
        if( ~(2^j <= N-M +1)) % find smallest j which is "too big", then
            use previous
            L = 2^(j-1); % no. of outputs per processing
            block break;
        end; % fi
    end; % for
else % multi-block processing
    L = M; % I/O shifts must match filter segmentation
end % if
% prepend (col) zeros s.t. 1st non-zero output is last L samples of 1st
block
x = [zeros( N-L,1); sig];
X = zeros( N,K); % K cols
sigOut = zeros( 0); % empty array
n = length( sig);
while( n > 0) % L inputs / outputs per iteration
    nOut = min( L,n);
    X = shift( X, 1, 2); % right-shifts matrix X by 1 col (dim=2)
    X(:,1) = fft( x( 1: N-L+nOut), N);
    % circular shift can be used, since fft input "controlled"
    x = shift( x, -L); % use negative value for left shift
    Y = zeros( N,1); % col
    for k = 1:K
        Y += H(:,k) .* X(:,k); % col += col x col
    end % for
    y = real( ifft( Y, N));
    sigOut = [sigOut; y( N-L+1: N-L+nOut)];
    n -= nOut;
```

TABLE 2-continued

```
end % while
% ..........................................................
end % function
```

Embodiments of the systems and methods described herein may be provided on any of several types of digital systems: digital signal processors (DSPs), general purpose programmable processors, application specific circuits, or systems on a chip (SoC) such as combinations of a DSP and a reduced instruction set (RISC) processor together with various specialized programmable accelerators. A stored program in an onboard or external (flash EEP) ROM or RAM may be used to implement the FIR filter processing. Analog-to-digital converters and digital-to-analog converters provide coupling to the real world, modulators and demodulators (plus antennas for air interfaces) can provide coupling for transmission waveforms, and packetizers can provide formats for transmission over networks such as the Internet.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Figure 5:
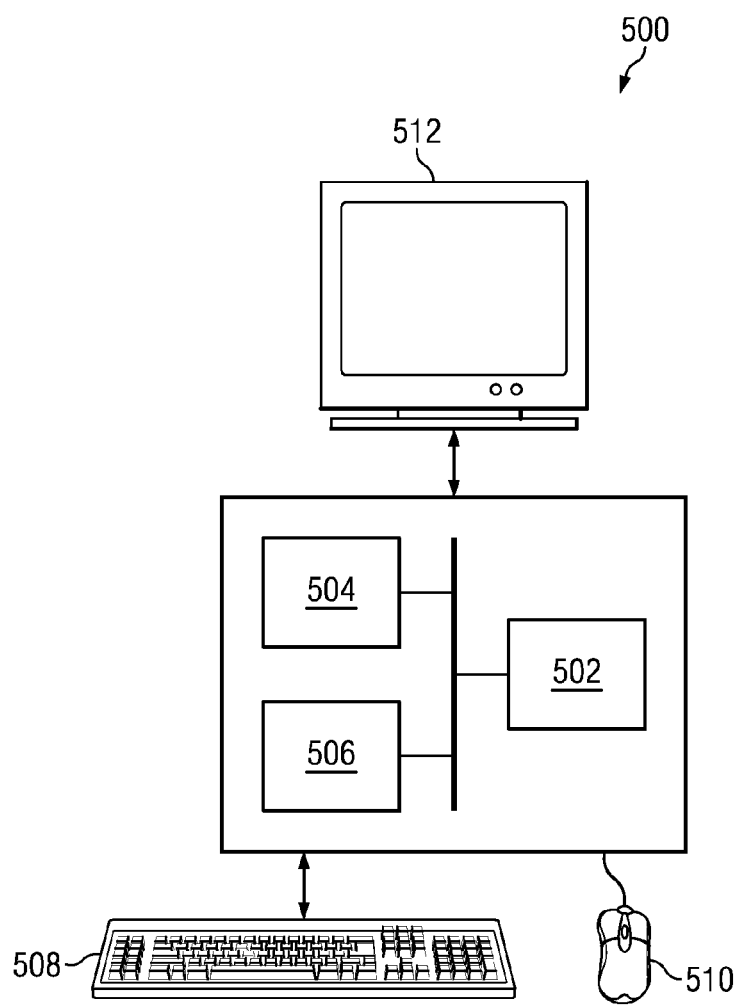
FIG. 5 shows an illustrative digital system in accordance with one or more embodiments of the invention.

Embodiments of the methods and encoders as described herein may be implemented for virtually any type of digital system (e.g., a desk top computer, a laptop computer, a handheld device such as a mobile (i.e., cellular) phone, a personal digital assistant, a digital camera, an automotive sound equalization system, etc. FIG. 5 shows a digital system (500) (e.g., a personal computer) suitable for implementing embodiments of the methods and systems described herein. The digital system (500) includes a processor (502), associated memory (504), a storage device (506), and numerous other elements and functionalities typical of digital systems (not shown). In one or more embodiments of the invention, a digital system may include multiple processors and/or one or more of the processors may be digital signal processors. The digital system (500) may also include input means, such as a keyboard (508) and a mouse (510) (or other cursor control device), and output means, such as a monitor (512) (or other display device). The digital system (500) may be connected to a network (514) (e.g., a local area network (LAN), a wide area network (WAN) such as the Internet, a cellular network, any other similar type of network and/or any combination thereof) via a network interface connection (not shown). Those skilled in the art will appreciate that the input and output means may take other forms.

Further, those skilled in the art will appreciate that one or more elements of the aforementioned digital system (500) may be located at a remote location and connected to the other elements over a network. Further, embodiments of the invention may be implemented on a distributed system having a plurality of nodes, where each portion of the system and software instructions may be located on a different node within the distributed system. In one embodiment of the invention, the node may be a digital system. Alternatively, the node may be a processor with associated physical memory. The node may alternatively be a processor with shared memory and/or resources.

Software instructions to perform embodiments of the invention may be stored on a computer readable medium such as a compact disc (CD), a diskette, a tape, a file, memory, or any other computer readable storage device. The software instructions may be distributed to the digital system (500) via removable computer readable media (e.g., floppy disk, optical disk, flash memory, USB key), via a transmission path from computer readable media on another digital system, etc.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims. It is therefore contemplated that the appended claims will cover any such modifications of the embodiments as fall within the true scope and spirit of the invention.

What is claimed is:

1. A computer readable medium storing executable instructions which, when executed by a processor, cause the processor to perform a method for finite impulse response (FIR) digital filtering, the method comprising:
   receiving an input sample block of L input samples of a signal;
   extending the input sample block to generate an extended sample block of length N, wherein the L input samples are preceded by N−L values;
   computing an N-point Discrete Fourier Transform (DFT) of the extended sample block to generate a frequency domain sample block;
   adding the computed frequency domain sample block to a reverse time-ordered set of previously generated frequency domain sample blocks as a newest frequency domain sample block in the reverse time-ordered set;
   computing a spectral multiplication of each of K newest frequency domain sample blocks in the reverse time-ordered set of previously generated frequency domain sample blocks with a corresponding frequency domain filter block in a time-ordered set of K frequency domain filter blocks of a FIR filter;
   adding the K results of the K spectral multiplications to generate an output spectral block;
   computing an N-point inverse DFT of the output spectral block to generate a time domain output block; and
   discarding N−L samples in the time domain output block to generate L filtered output samples,
   wherein NH is a length of the FIR filter, M is a length of each of K time domain filter blocks of the FIR filter, L=M, K=ceil (NH/M), and N≥L+M−1.

2. The computer readable medium of claim 1, wherein the N−L values are N−L samples from another input sample block immediately preceding the input sample block.

3. The computer readable medium of claim 1, wherein L=M=N/2.

4. The computer readable medium of claim 1, wherein the method further comprises:
   segmenting an impulse response of the FIR filter into K time domain filter blocks; and
   computing an N-point Discrete Fourier Transform (DFT) of each of the K time domain filter blocks to generate the K frequency domain filter blocks.

5. The computer readable medium of claim 1, wherein adding the computed frequency domain sample block comprises removing an oldest frequency domain sample block from the reverse time-ordered set.

6. The computer readable medium of claim 5, wherein removing an oldest frequency domain sample block comprises replacing the oldest frequency domain sample block with the computed frequency domain sample block.

7. The computer readable medium of claim 1, wherein the N-point DFT is implemented with a Fast Fourier Transform (FFT) algorithm and the N-point inverse DFT is implemented with an inverse FFT algorithm.

8. A digital system comprising:
   a processor; and
   a memory storing software instructions, wherein when executed by the digital signal processor, the software instructions cause the digital system to perform a method for finite impulse response (FIR) digital filtering, the method comprising:
      receiving an input sample block of L input samples of a signal;
      extending the input sample block to generate an extended sample block of length N, wherein the L input samples are preceded by N−L values;
      computing an N-point Discrete Fourier Transform (DFT) of the extended sample block to generate a frequency domain sample block;
      adding the computed frequency domain sample block to a reverse time-ordered set of previously generated frequency domain sample blocks as a newest frequency domain sample block in the reverse time-ordered set;
      computing a spectral multiplication of each of K newest frequency domain sample blocks in the reverse time-ordered set of previously generated frequency domain sample blocks with a corresponding frequency domain filter block in a time-ordered set of K frequency domain filter blocks of a FIR filter;
      adding the K results of the K spectral multiplications to generate an output spectral block;
      computing an N-point inverse DFT of the output spectral block to generate a time domain output block; and
      discarding N−L samples in the time domain output block to generate L filtered output samples,
         wherein NH is a length of the FIR filter, M is a length of each of K time domain filter blocks of the FIR filter, L=M, K=ceil (NH/M), and N≥L+M−1.

9. The digital system of claim 8, wherein the N−L values are N−L samples from another input sample block immediately preceding the input sample block.

10. The digital system of claim 8, wherein L=M=N/2.

11. The digital system of claim 8, wherein the method further comprises:
   segmenting an impulse response of the FIR filter into K time domain filter blocks; and
   computing an N-point Discrete Fourier Transform (DFT) of each of the K time domain filter blocks to generate the K frequency domain filter blocks.

12. The digital system of claim 8, wherein adding the computed frequency domain sample block comprises removing an oldest frequency domain sample block from the reverse time-ordered set.

13. The digital system of claim 12, wherein removing an oldest frequency domain sample block comprises replacing the oldest frequency domain sample block with the computed frequency domain sample block.

* * * * *